(12) United States Patent
Wester (10) Patent No.: US 6,577,342 B1
(45) Date of Patent: Jun. 10, 2003

(54) IMAGE SENSOR WITH MICROLENS MATERIAL STRUCTURE

(75) Inventor: Neil S. Wester, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/160,386

(22) Filed: Sep. 25, 1998

(51) Int. Cl.[7] .............................. H04N 3/14; H04N 5/225
(52) U.S. Cl. ...................... 348/340; 348/302; 348/342; 216/26; 257/294; 257/432; 359/619
(58) Field of Search ................. 250/208.1; 257/428, 257/431, 432, 294, 291, 290; 348/222.1, 223.1, 224.1, 272, 273–276, 294, 302, 307–311, 315, 335, 340, 342; 430/320, 321; 438/69, 70, 71; 216/24, 26

(56) References Cited

U.S. PATENT DOCUMENTS

| 5,286,605 | A | * | 2/1994 | Nishioka | 250/208.1 |
| 5,452,004 | A | * | 9/1995 | Roberts | 348/301 |
| 5,605,783 | A | * | 2/1997 | Revelli | 430/321 |
| 5,677,202 | A | * | 10/1997 | Hawkins | 438/70 |
| 6,249,034 | B1 | * | 6/2001 | Li | 257/432 |
| 6,362,513 | B2 | * | 3/2002 | Wester | 257/432 |

* cited by examiner

Primary Examiner—Ngoc-Yen Vu
(74) Attorney, Agent, or Firm—Blakely, Sokoloff, Taylor & Zafman LLP (57) ABSTRACT

An optical device including a semiconductor-based substrate having a photosensitive circuit including a photosensitive area a portion of which is covered by color filter array material, a contact area surrounding the photosensitive area, and a microlens material overlying the portion of the photosensitive area and a portion of a contact area.

18 Claims, 7 Drawing Sheets

IMAGE SENSOR WITH MICROLENS MATERIAL STRUCTURE

BACKGROUND OF THE INVENTION

1. Field of the Invention

The invention relates to optical devices and more particularly to protecting image sensor during die handling.

2. Description of Related Art

Digital imaging systems, such as for example digital cameras, utilize integrated circuit devices or chips as image capturing devices. An imaging system, such as a camera, uses light to capture an image on a semiconductor-based chip. The chip replaces film in traditional film-based systems. In a digital camera, an image sensor is configured, in its simplest form, to capture a monochrome or color image by way of field effect transistors (FETs), such as complementary metal oxide semiconductor (CMOS) devices or charge coupled devices (CCDs).

In one example, the image sensor is a semiconductor chip made up of a number of photosensitive circuits, each photosensitive circuit capable of absorbing light. In color applications, each photosensitive circuit generally absorbs light through a color filter that represents a particular wavelength of light in the visible spectrum corresponding to the image sensed.

The photosensitive circuits of an image sensor, often referred to as pixel circuits, are generally arranged in an array such as for example 480 rows by 640 columns. In general, each photosensitive circuit or pixel circuit contains a photosensitive element, such as a photodiode, and other circuitry. The photosensitive element defines a photosensing region or area of the photosensitive circuit that responds to light while the circuitry, generally speaking, drives a light signal from the photosensitive region or area to other process circuitry. Typically the image sensor is surrounded at its edges by bond pads that electrically connect the image sensor to the other components of the imaging system.

The CMOS- or CCD-based image sensor is formed as a chip or die of a wafer of a number of chips and dies. Once formed, the wafer is divided into individual chips or dies using conventional wafer dividing tools. The individual chips or dies are then removed from the processing station by a die handler such as a collet. During the die handling process, there is a possibility of damaging the individual dies or chips. The damage translates to unit losses.

Prior efforts to minimize the unit losses encountered by die or chip handling processes include placing a scratch protection layer outside the photosensitive region or area of the chip that is resistant to damage during the die or chip handling process. One method involves placing color filter array (CFA) material outside the photosensitive region or area to act as a scratch protection layer. The primary use of CFA material is over the photosensitive region or area to absorb light according to a particular wavelength of the visible spectrum, allowing the image sensor to interpret color images.

CFA material is typically a photo-imageable material such as an acrylic resin with a pigment or die. The material is coated on a wafer, baked, and exposed to ultraviolet light through a mask to crosslink or polymerize the CFA material where desired. The remainder of the CFA material is then removed. One problem with CFA material is incomplete crosslinking. Incomplete crosslinking leads to defects in the CFA material. One way to reduce the number of defects caused by incomplete crosslinking is to minimize the area covered by CFA material. Thus, prior art efforts that use CFA material as a scratch protection layer increase the area of usage on the image sensor of CFA material and therefore increase the defect count of the CFA material.

Thus, what is needed is a suitable scratch protection material to minimize unit losses that does not increase the defect count of CFA material on a sensor.

SUMMARY OF THE INVENTION

An optical device is disclosed. The optical device includes a semiconductor-based substrate having a photosensitive circuit including a photosensitive area a portion of which is covered by color filter array material, a contact area surrounding the photosensitive area, and a microlens material overlying the portion of the photosensitive area and a portion of a contact area.

BRIEF DESCRIPTION OF THE DRAWINGS

FIG. 3b shows a schematic perspective top view of the sensor of FIG. 3a.

DETAILED DESCRIPTION OF THE INVENTION

The invention relates to an optical device, such as an image sensor of an integrated circuit. In one embodiment, the optical device has a photosensitive circuit including a photosensitive area a portion of which is covered by CFA material. The optical device also has, in this embodiment, a contact area surrounding the photosensitive area and a microlens material overlying a portion of the photosensitive area and a portion of the contact area. In this manner, the microlens material acts as both a microlens and a scratch protection layer. In this manner, the scratch protection layer may be formed at the same time as the microlenses of the optical device thus reducing the number of processing or fabricating steps in making the optical device of the invention compared to prior art processing or fabricating methods.

In one embodiment, the microlens material is a durable acrylic that is resistant to degradation or chipping during a die or chip pick and place handling. Accordingly, the scratch protection afforded by using the microlens material minimizes possible contamination of the sensor area by particles being chipped or broken away from the passivation material during the die pick and place handling or other handling. Finally, the use of material other than CFA material as the scratch protection layer material allows the use of the CFA material on a given sensor to be minimized and therefore the defect count associated with CFA material to be lower.

Figure 1:
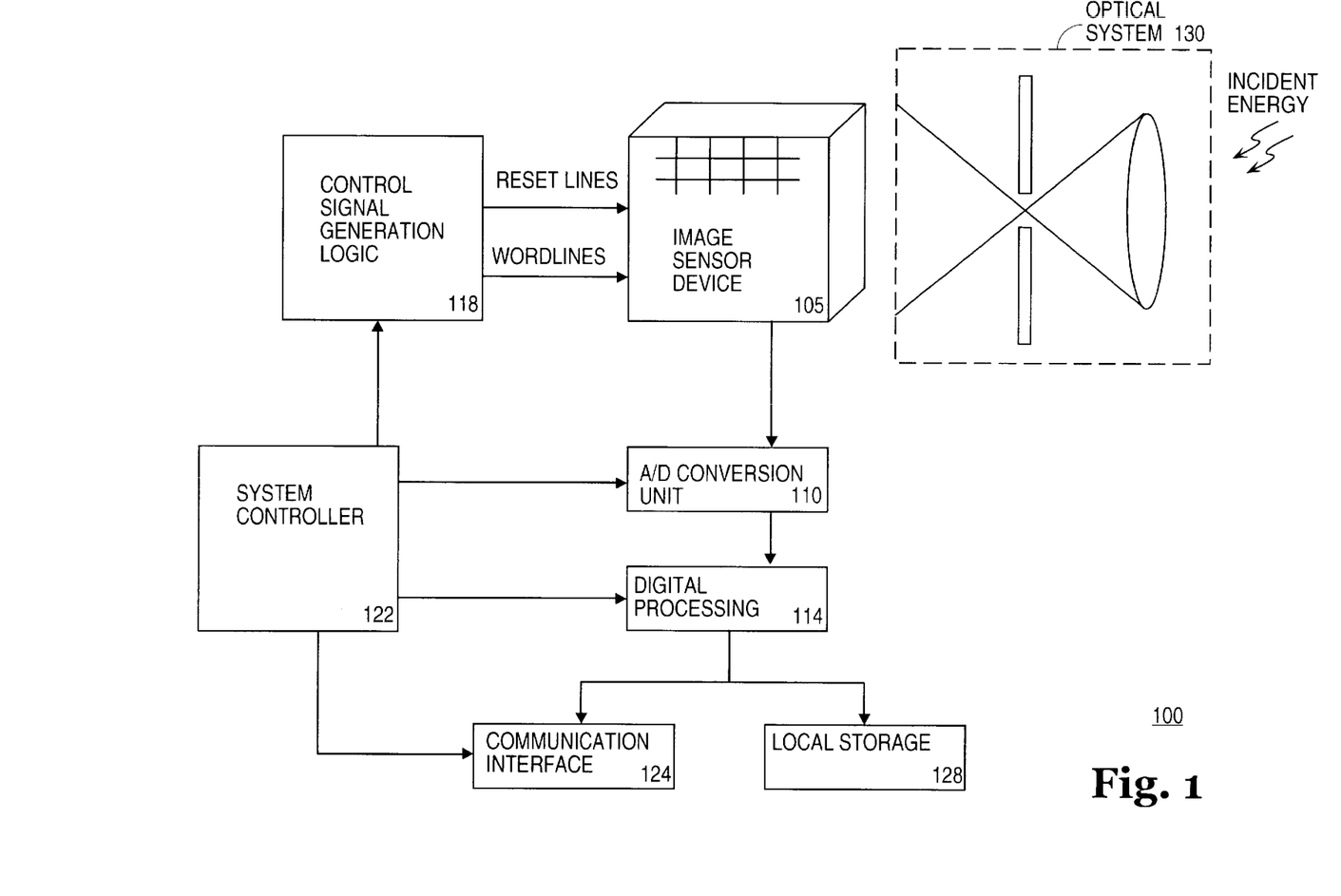
FIG. 1 is a diagram showing an imaging system incorporating an image sensor of an embodiment of the invention.

FIG. 1 illustrates an embodiment of an imaging system. Imaging system 100 includes optical system 130 that channels the incident energy, e.g., light, to create an optical image on image sensor unit or image sensing unit 105. Control signal generation logic 118 is provided to generate reset signals in word lines needed to control photosensitive circuits of image sensor unit 105. Output values (e.g., sensor signals) may be processed in analog form before being fed to an analog-to-digital (A/D) conversion unit 110 that in turn feeds digital processing block 114. A/D unit 110, and portions of the digital processing block 114 may be located on the same die or chip as the photosensitive circuit. Digital processing block 114 may include hard-wired logic and/or a programmed processor that performs a variety of digital functions, including preparing digital image data based on the sensor signals for storage or transmission.

Transmission of the image data to an external processing system may be accomplished using communication interface 124. For instance, as a digital camera, system 100 will contain a communication interface that implements a computer peripheral bus standard such as universal serial bus (USB) or IEEE 1394–1995. Imaging system 100 may also contain local storage 128 of the non-volatile variety including, for instance, a solid state memory such as a removable memory card, a rotating magnetic device, or other suitable memory device for permanent storage of digital image data. The operation of imaging system 100 may be orchestrated by system controller 122 that may include a conventional microcontroller responding to instructions stored as firmware.

Figure 2:
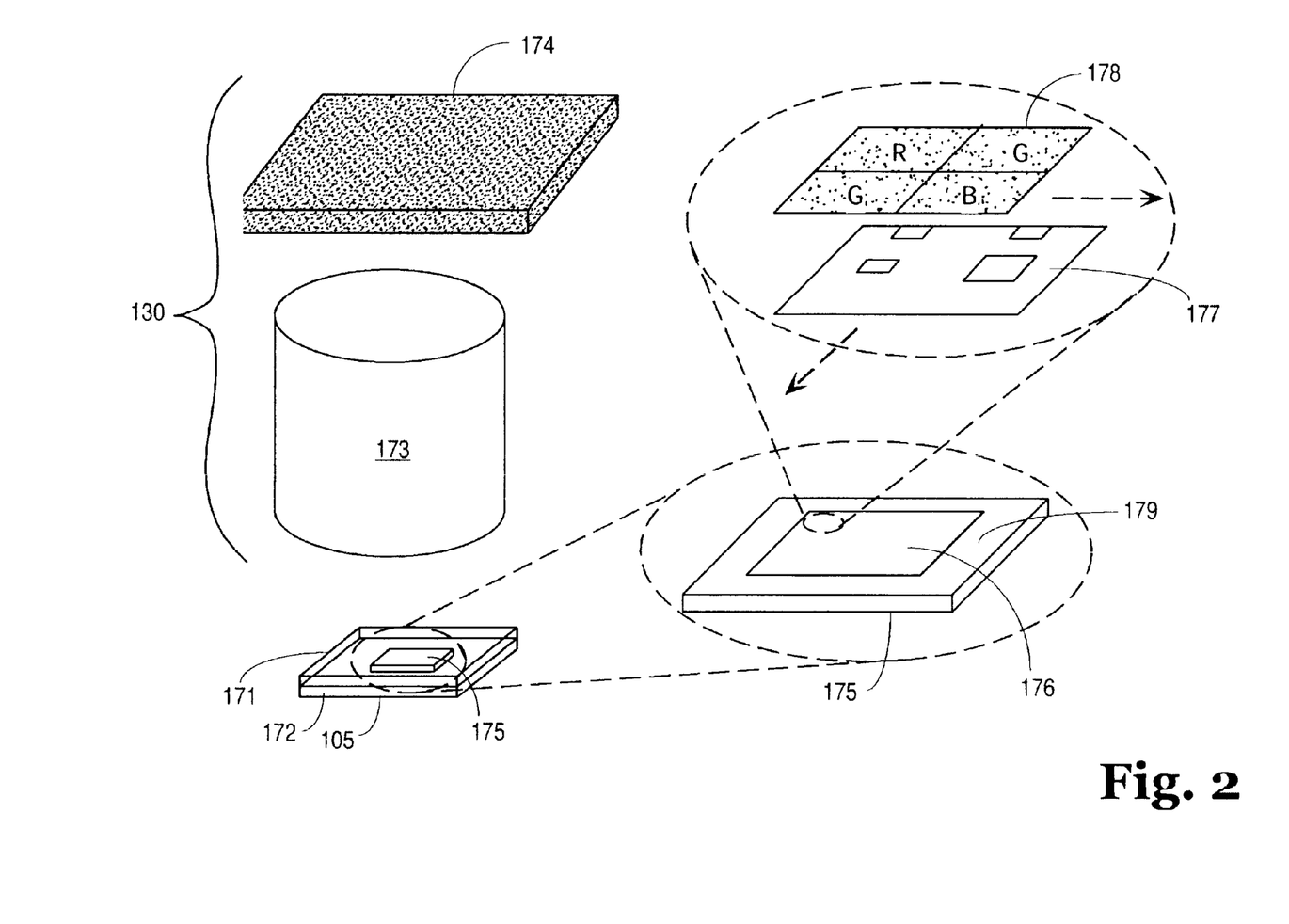
FIG. 2 shows a diagrammatical view of a portion of the imaging system of FIG. 1.

FIG. 2 shows a diagrammatical view of an embodiment of a portion of a digital imaging system including optical system 130 and image sensor unit 105. Image sensor unit 105 includes image sensor 175 in package 172. Conventional materials for package 172 include, but are not limited to, ceramic and plastic. In one embodiment, the top surface of package 172 includes a transparent cover substrate 171, such as glass or plastic, that overlies image sensor 175.

Overlying image sensor unit 105 and referenced as optical system 130 is lens assembly 173 and infrared blocking filter 174. Infrared blocking filter 174 overlies lens assembly 173 and serves to inhibit, infrared light from striking image sensor unit 105.

In the insert of FIG. 2 is a magnified view of image sensor 175. A magnified view of image sensor 175 in turn shows some additional sensor components. Included within the components shown in FIG. 2 is the uppermost metal layer 177 having illustrative openings intended to modulate photosensitive circuit or pixel circuit responsitivity. Overlying metal layer 177 is an array or mosaic of color filter array (CFA) material 178 covering, in this instance, four different photosensitive circuits or pixel circuits of image sensor 175: One Red, two Green, and one Blue. The array or mosaic represents an illustrative tiling pattern for CFA material 178.

Figure 3A:
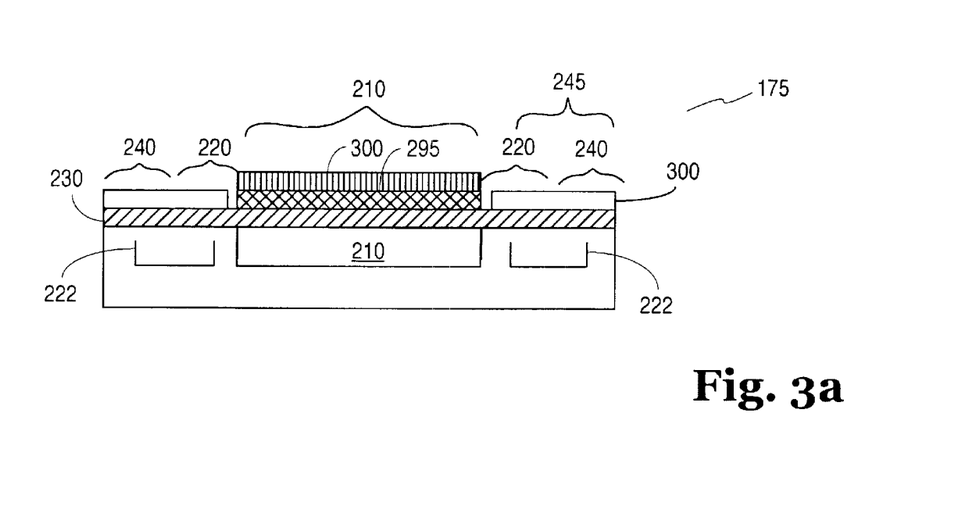
FIG. 3a shows a schematic, cross-sectional side view of the image sensor of FIG. 1 that may be used in an embodiment of the invention.
Figure 3B:
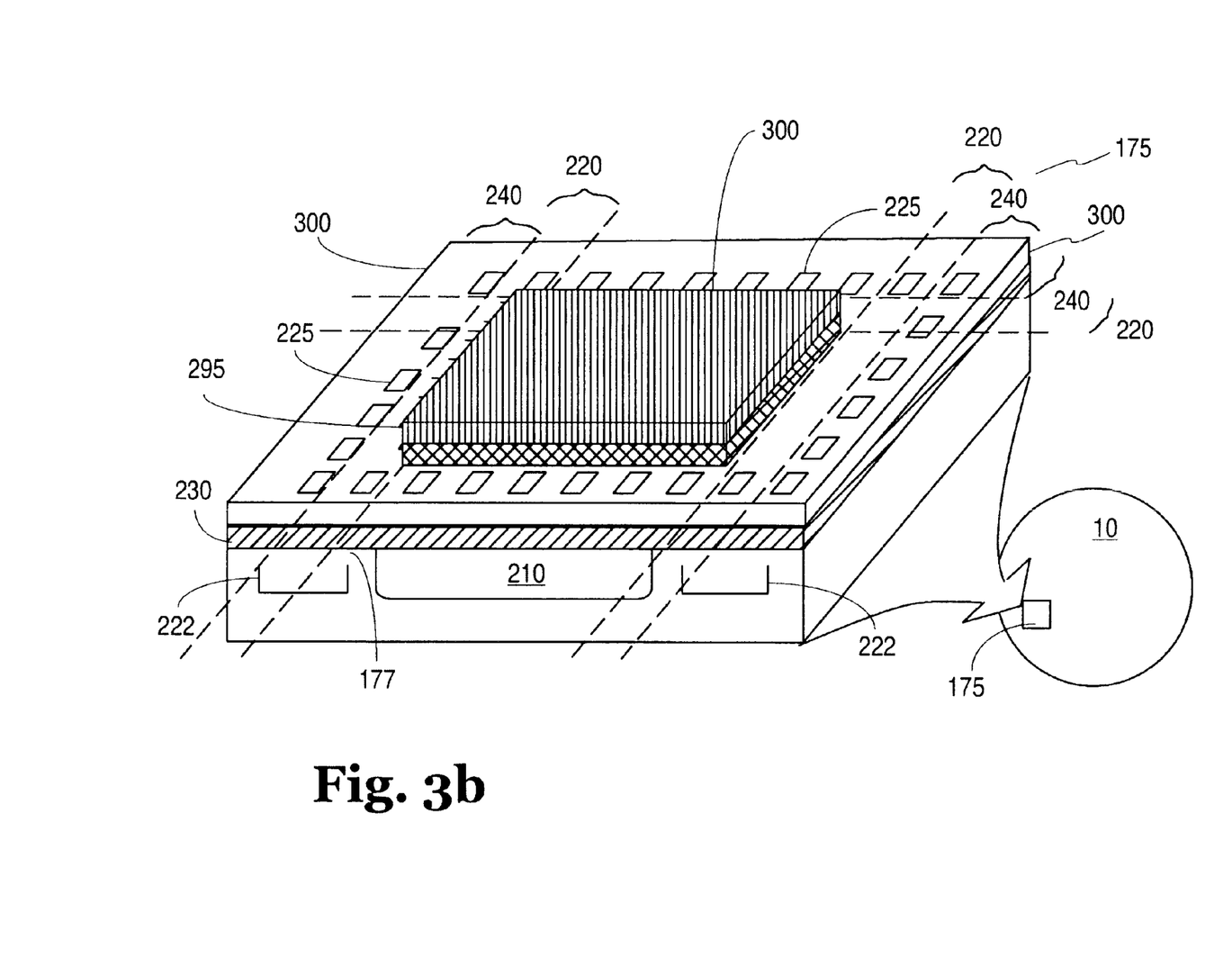

In one example, image sensor 175 is a chip made up of a number of photosensitive circuits, each photosensitive circuit capable of absorbing light. FIG. 3a illustrates a schematic, planar side view of a portion of image sensor 175. FIG. 3b illustrates a top perspective view of image sensor 175. Image sensor 175 is fabricated, in this embodiment, as part of a die or wafer 10 with a plurality of other devices. Once formed, individual image sensors are separated from one another typically by a sawing process. The individual image sensors are then placed in a package, such as package 172, of image sensor unit 105 as described above.

In FIGS. 3a and 3b, the photosensing region or area of image sensor 175 is illustratively represented by photosensitive area 210. In addition to photosensitive area 210, image sensor 175 contains additional logic circuitry that operates the individual photosensitive circuits and drives signals from the pixels off image sensor 175. In FIGS. 3a and 3b, the logic circuitry occupies an area of image sensor 175 illustratively represented by logic area 220. It is to be appreciated that logic circuitry is not or need not be limited to logic area 220. Logic area 220 typically represents an area around the periphery of the sensor of logic circuitry as opposed to photosensitive structures, like photodiodes.

To provide power to image sensor 175 and to drive signals on and off image sensor 175, image sensor 175 contains bond pads 225. Bond pads 225 are generally arranged on the periphery or top surface of image sensor 175 and surround photosensitive area 210 and logic area 220. Bond pads 225 are typically located on the extreme periphery of image sensor 175 in contact or bond pad area 240. Bond pads 225 are electrically linked or coupled to device circuitry 222 that may include logic circuitry. In FIG. 3a and 3b, logic area 220 and contact or bond pad area 240 collectively define non-photosensitive area 245, separate from photosensitive area 210.

Overlying the top surface of image sensor 175 is transparent passivation layer 230. Passivation layer 230 is, for example, silicon nitride ($Si_3N_4$) or silicon oxynitride ($Si_xN_yO_z$). $Si_3N_4$ and $Si_xN_yO_z$ are chosen because of their transparent properties and their particular resistance to environmental contaminants, particularly moisture. Passivation layer 230 is deposited to a suitable thickness, such as for example approximately 8,000 angstroms (Å) according to current technology. Passivation layer 230 overlies the entirety of image sensor 175, including photosensitive area 210 and non-photosensitive area 245 (logic area 220 and bond pad area 240).

Overlying passivation layer 230, particularly in photosensitive area 210, is CFA material 295 such as dyed- or pigmented-photoresist. CFA material 295 is patterned into an array of color filter channels, one channel typically above one photosensitive circuit or pixel circuit. The color channels selectively allow light corresponding to a predetermined range of the visible spectrum to pass through a channel to image sensor 175. The group of color filter channels (e.g., Red, Green, Blue) make up a color system that either alone or by a mathematical manipulation, match or predict the human eye response.

Overlying CFA material 295 is microlens material 300. Microlens material serves, in one aspect to increase the light collecting efficiency of each photosensitive circuit. The photosensitive element of each photosensitive circuit is typically surrounded by layers of conductive (e.g., interconnection lines) and non-conductive (e.g., insulating dielectric) layers creating a valley effect in which the photosensitive element, such as a photodiode, is at the base of the valley. A portion of light directed at an angle toward the photosensitive element can be obstructed from striking the photosensitive element by the surrounding layers. Microlens material 300 overlying the photosensitive circuit serves in one aspect, to redirect the otherwise obstructed light at the photosensitive element. Thus, the final shape of microlens material 300 in part, determines the amount of light directed at the photosensitive element.

In an embodiment of the invention, microlens material 300 also overlies a portion of non-photosensitive area 245. In this manner, microlens material 300 serves as a scratch protection layer to protect image sensor 175 during, for example, a die pick-and-place handling process. In FIGS. 3a and 3b, microlens material 300 overlies passivation layer 230 in a portion of non-photosensitive area 245, including a portion of logic area 220 and contact or bond pad area 240. Bond pads 225 are exposed through microlens material 300 allowing contacts to be made to bond pads 225.

Figure 4:
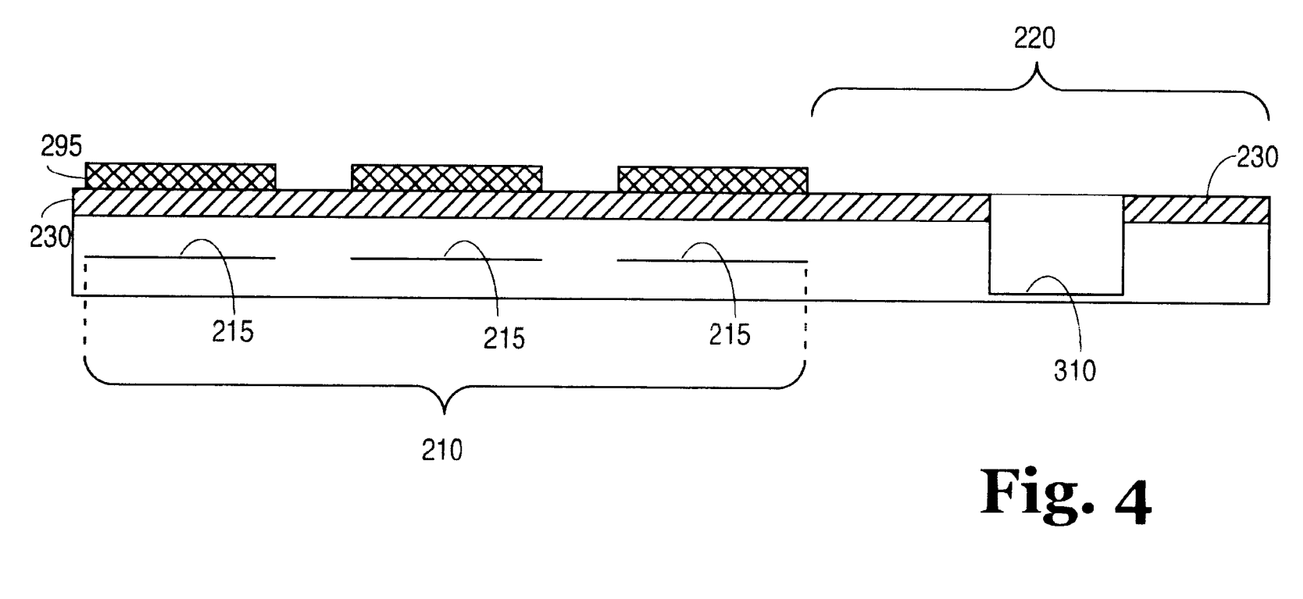
FIG. 4 shows a cross-sectional side view of a portion of an image sensor including three photosensitive circuits and a bond pad, a passivation layer overlying the photosensitive circuits with the bond pad exposed, and color filter material overlying the passivation layer in a photosensitive area in accordance with an embodiment of the invention.

FIGS. 4–7 illustrate processing steps associated with forming an embodiment of an image sensor optical device according to the invention. FIG. 4 shows a cross-sectional side view of a portion of an image sensor having a photosensitive area 210 and a non-photosensitive area 220. Photosensitive area 210 includes, in this illustration, three photosensitive circuits 215 formed in and on a semiconductor substrate such as for example CMOS- or CCD-based photosensitive circuits. Overlying each photosensitive circuit 215 is passivation layer 230 of, for example, $Si_3N_4$ or $Si_xN_yO_z$. Overlying passivation layer 230 is CFA material 295 patterned particularly over the photosensitive element of each of photosensitive circuits 215. Non-photosensitive area 220 of the image sensor includes logic area 220 and contact or bond pad area 240 such as described above with reference to FIGS. 3a and 3b. FIG. 4 shows bond pad 310 formed in non-photosensitive area 220 and passivation layer 230 overlying a portion of non-photosensitive area 220 with bond pad 310 exposed through passivation layer 230.

Figure 5:
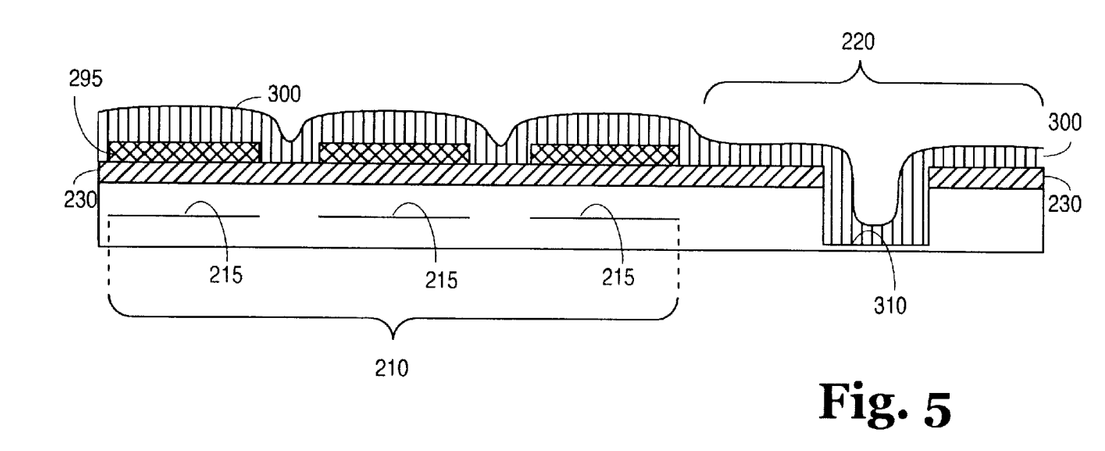
FIG. 5 shows the image sensor of FIG. 4 after the further processing step of depositing a microlens material over the top surface of the image sensor in accordance with an embodiment of the invention.

FIG. 5 shows the image sensor of FIG. 4 after the further processing step of conformally depositing microlens material 300 over the image sensor. At this point, it is to be appreciated that the portion of the image sensor shown is actually a portion of a wafer made out of a number of image sensors. The conformal deposit of microlens material is made, in this embodiment, across the wafer in both photosensitive areas and non-photosensitive areas of each image sensor die or chip.

In one embodiment, microlens material 300 is a photoimageable acrylic resin material that is spun on the entire wafer to a desired thickness for the resulting microlenses, such as for example 1–3 μm. Suitable materials for microlens material 300 include those materials that have high transmissivity (greater than 90 percent) across the visible spectrum of light (380–780 nm), and are resistant to aging effects (e.g., oxidation, decomposition), environmental effects (e.g., moisture uptake, heat resistance), and physical effects (e.g., stress, deformation). A suitable material for microlens material 300 includes but is not limited to, OPT-MER LC-793A, manufactured by JSR Corporation of Tokyo, Japan. A second suitable material for microlens material 300 is a phenolic resin-based JSR MFR-324X, manufactured by Japan Synthetic Rubber Company, Ltd., of Tokyo, Japan.

The spin coating step of FIG. 5 is followed by a baking step (e.g., about 100° C. for one minute) to evaporate any casting solvent in microlens material 300. A light source, such as an actinic light source (300–450 nm), is introduced on the wafer through a reticle or mask to define a microlens pattern over the photosensitive elements of photosensitive area 210 and over non-photosensitive area 220. In one embodiment an actinic light of 365 nm at about 200 $mJ/cm^2$ is utilized. The actinic light converts the photoactive compound in microlens material 300 to an acid to make the acrylic resin material base soluble. The unexposed areas remain base insoluble. Once the desired transition in solubility is substantially complete, a base, such as an ammonium hydroxide solution, is applied to remove the exposed portions of microlens material 300.

Figure 6:
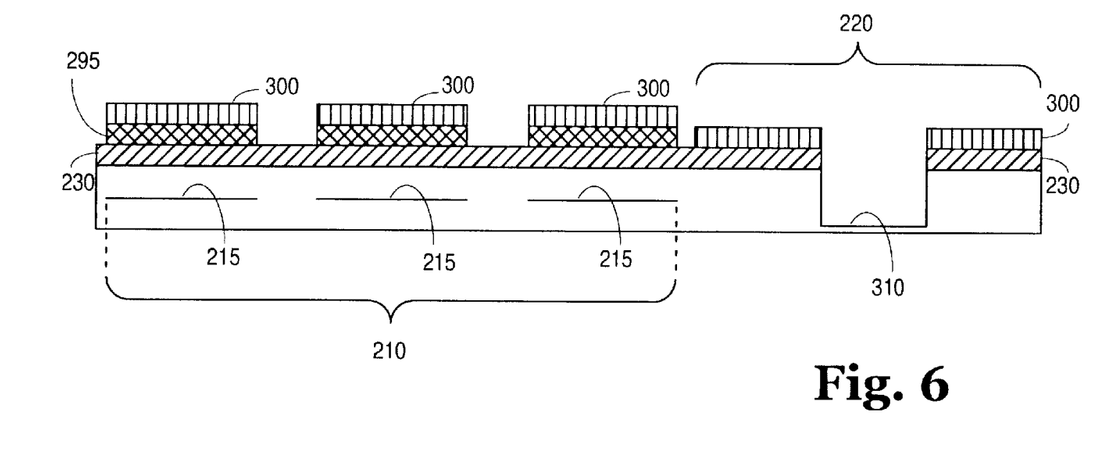
FIG. 6 shows the sensor of FIG. 4 after the further processing step of patterning the microlens material over the CFA material with the bond pad exposed in accordance with an embodiment of the invention.

FIG. 6 shows the portion of the wafer of FIG. 4 after the initial patterning of microlens material 300 over photosensitive structures in photosensitive area 210 (in this case over CFA material 295) and over non-photosensitive area 220. It is noted that in non-photosensitive area 220, microlens material 300 is removed over bond pad 310.

In some devices, particularly CCD devices where the valley effect discussed above is not as significant, it may be desirable to place a planarization layer over the wafer or CFA material layer 295 prior to forming microlens structure. In such case, the step of depositing microlens material 300 would follow the planarization step.

Figure 7:
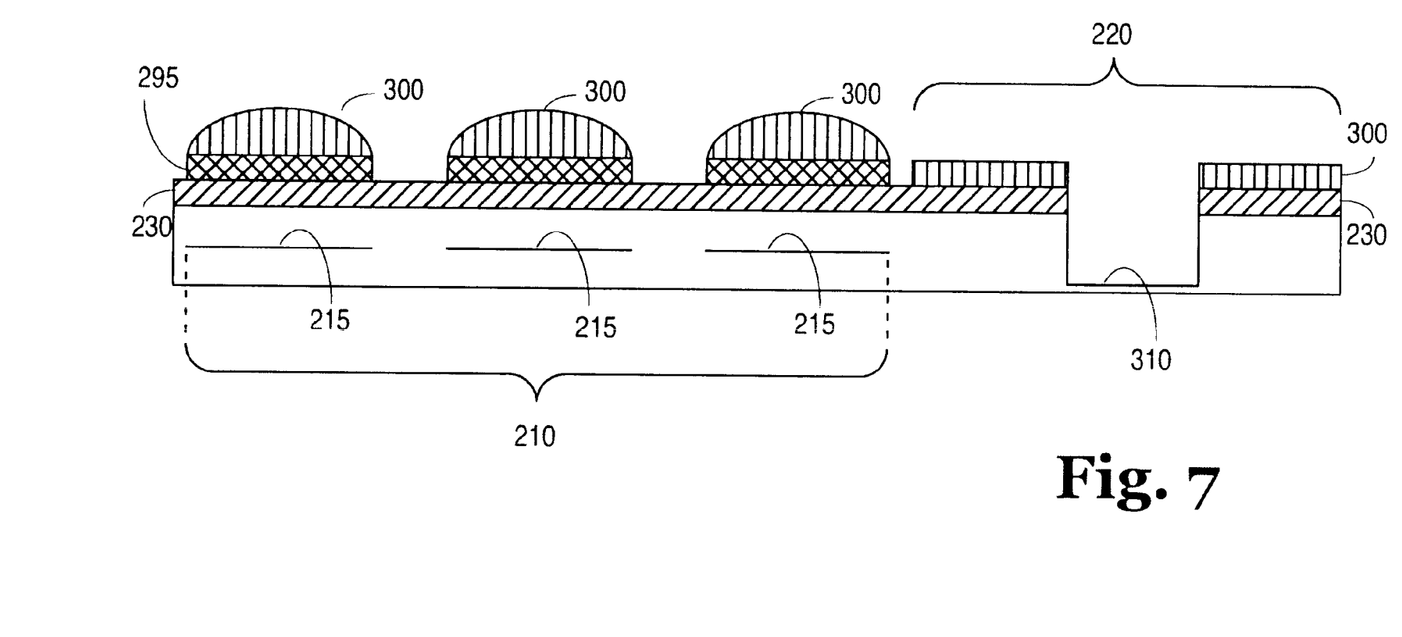
FIG. 7 shows the image sensor of FIG. 4 after the further processing step of forming a desired microlens shape over the CFA material in accordance with an embodiment of the invention.

Once microlens material 300 is initially patterned, the wafer is baked in a reflow baking step (e.g., about 130° C. for one minute) to further crosslink and polymerize microlens material 300. The heat causes microlens material 300 to flow to form the desired microlens shape over photosensitive area 210. In general, the surface tension of microlens material 300 over CFA material 295 will cause microlens material 300 in those areas to adopt a curved or arcuate shape over CFA material 295. One aspect of the curved shape is that the shape allows light entering an individual photosensitive circuit at an angle to be directed toward the photosensitive element of the photosensitive circuit. The extent of the curvature of microlens material 300 will depend on the thickness of the initial microlens material 300 layer. An initial deposition and patterning of microlens material 300 to a thickness of about 1–3 μm generally yields a microlens having the desired curvature for current technologies.

It is also to be appreciated that the area covered by microlens material 300 in non-photosensitive area 220 is much larger than the individual areas covered by microlens material 300 in photosensitive area 210 (e.g., the designated areas above each photosensitive circuit 215 or CFA material 295 structures). In this manner, the curvature associated with the melting of microlens material 300 in photosensitive area 210 is generally not seen in non-photosensitive area 220.

After the desired curvature of microlens material 300 over the individual circuits in photosensitive area 210 is substantially achieved, the wafer may be subjected to a second exposure of actinic light, a "flood exposure" at, for example, approximately 100 $mJ/cm^2$, to decompose the remaining photoactive compounds in previously unexposed microlens material 300. One aspect of the flood exposure is that the decomposition of photoactive compounds in microlens material 300 tends to increase the transmittance of microlens material 300 in the "blue" region of the visible spectrum. Following the flood exposure, the wafer is subjected to a "hard bake" to cross-link microlens material 300 (e.g., about 200° C. for one minute). The cross-linking stabilizes the film making it generally physically, chemically, and environmentally resistant.

Patterning microlens material 300 in non-photosensitive area 220 allows microlens material 300 to perform the additional function of acting as a die or chip scratch protection layer. The use of microlens material 300 optimizes the image sensor processing or fabricating step by utilizing microlens material that would otherwise be rinsed and cleaned from the individual image sensors die or chip. Further, since the application of microlens material 300 is done as one of the final steps in processing or fabrication, the need for additional processing step(s) that subjects both bond pad 310 and photosensitive area 210 of the image sensor to contamination (e.g., deposition, etching, etc.) are eliminated. In general, microlens material 300 is a durable material that is resistant to chipping and breakage making it suitable for scratch protection areas during die or chip pick-and-place handling. Finally, eliminating the use of CFA material 295 as a scratch protection layer minimizes the use of CFA material 295 on an individual image sensor die or chip thus reducing the defect count that must be considered when using this material.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An optical device comprising:
    a semiconductor based substrate having a photosensitive circuit including a photosensitive element a portion of which is covered by a color filter array material;
    a non-photosensitive area surrounding the photosensitive circuit; and
    a microlens material overlying a portion of the photosensitive element and a portion of the non-photosensitive area, wherein the microlens material overlying a portion of the photosensitive element is separate from the microlens material overlying a portion of the non-photosensitive area.

2. The optical device of claim 1, wherein the microlens material comprises a material having a transmissivity greater than 90 percent across the visible spectrum.

3. The optical device of claim 1, wherein the non-photosensitive area comprises a plurality of electrical contacts and wherein a portion of each of the electrical contacts is exposed through the microlens material.

4. The optical device of claim 3, wherein the electrical contacts comprise bond pads.

5. An imaging system comprising:
    an imaging sensor of an integrated circuit having a sensor portion with a plurality of photosensitive circuits providing sensor signals in response to incident light and control signals and a non-sensor portion, a microlens material overlying a portion of the sensor portion and a portion of the non-sensor portion, wherein the microlens material overlying a portion of the sensor portion is separate from the microlens material overlying a portion of the non-sensor portion;
    control circuitry configured to generate the control signals for controlling the imaging sensor; and
    signal processing circuitry for generating image data in response to the sensor signals.

6. The imaging system of claim 5, wherein the microlens material comprises a material having a transmissivity greater than 90 percent across the visible spectrum.

7. The imaging system of claim 5, wherein the non-sensor area comprises a plurality of electrical contacts and wherein a portion of each of the electrical contacts is exposed through the microlens material.

8. The imaging system of claim 7, wherein the electrical contacts comprise bond pads.

9. A method of forming a scratch protection layer comprising:
    depositing a microlens material over a photosensitive area of an integrated circuit chip and over a non-photosensitive area of the integrated circuit chip; and
    patterning the microlens material deposited such that the microlens material overlying a portion of the photosensitive area is separate from the microlens material overlying a portion of the non-photosensitive area.

10. The method of claim 9, wherein the microlens material comprises a material having a transmissivity greater than 90 percent across the visible spectrum.

11. The method of claim 9, further comprising exposing contacts in the non-photosensitive area through the microlens material.

12. An image sensor comprising:
    a photosensitive area including a plurality of photosensitive circuits;
    a non-photosensitive area surrounding the photosensitive area;
    a plurality of microlenses, each microlens positioned above a respective one of the photosensitive circuits; and
    at least one microlens material structure positioned above a portion of the non-photosensitive area, wherein the at least one microlens material structure positioned above the non-photosensitive area is separate from the plurality of microlenses positioned above the photosensitive circuits.

13. The image sensor of claim 12, wherein an area covered by the at least one microlens material structure is greater than an individual area covered by each microlens.

14. The image sensor of claim 12, wherein each of the microlenses has a curved surface.

15. The image sensor of claim 14, wherein a curvature of the at least one microlens material structure positioned above the non-photosensitive area is less than a curvature of each microlens.

16. The image sensor of claim 12, further comprising a color filter array disposed between the plurality of microlenses and the plurality of photosensitive circuits.

17. The image sensor of claim 12, wherein the non-photosensitive area comprises a plurality of electrical contacts and wherein a portion of each of the electrical contacts is exposed through the microlens material.

18. The image sensor of claim 12, wherein the at least one microlens material structure positioned above the non-photosensitive area serves as a scratch protection layer.

* * * * *